(12) United States Patent
Casagrande

(10) Patent No.: US 9,484,109 B2
(45) Date of Patent: Nov. 1, 2016

(54) MEMORY CELL AND MEMORY DEVICE

(71) Applicant: The Swatch Group Research and Development Ltd, Marin (CH)

(72) Inventor: Arnaud Casagrande, Bole (CH)

(73) Assignee: The Swatch Group Research and Development Ltd., Marin (CH)

( * ) Notice: Subject to any disclaimer, the term of this patent is extended or adjusted under 35 U.S.C. 154(b) by 0 days.

(21) Appl. No.: 14/533,583

(22) Filed: Nov. 5, 2014

(65) Prior Publication Data
US 2015/0124512 A1     May 7, 2015

(30) Foreign Application Priority Data

Nov. 5, 2013 (EP) ..................................... 13191675

(51) Int. Cl.
| | |
|---|---|
| *G11C 17/00* | (2006.01) |
| *G11C 17/04* | (2006.01) |
| *G11C 17/16* | (2006.01) |
| *G11C 17/18* | (2006.01) |

(52) U.S. Cl.
CPC ............... *G11C 17/04* (2013.01); *G11C 17/16* (2013.01); *G11C 17/18* (2013.01)

(58) Field of Classification Search
CPC .............................. G11C 17/165; G11C 17/00
USPC ...................................... 365/96, 94, 102, 104
See application file for complete search history.

(56) References Cited

U.S. PATENT DOCUMENTS

| | | | |
|---|---|---|---|
| 5,056,061 A | 10/1991 | Akylas et al. | |
| 5,742,555 A | 4/1998 | Marr et al. | |
| 6,055,205 A * | 4/2000 | Rao | G11C 16/08 365/104 |
| 6,522,582 B1 * | 2/2003 | Rao | G11C 16/08 365/104 |
| 6,856,540 B2 | 2/2005 | Peng et al. | |
| 8,208,312 B1 | 6/2012 | Novosel et al. | |
| 2002/0074616 A1 | 6/2002 | Chen et al. | |
| 2008/0042234 A1 | 2/2008 | Yamaguchi | |
| 2008/0157125 A1 | 7/2008 | Kim et al. | |
| 2009/0284504 A1 | 11/2009 | Shin et al. | |
| 2010/0109683 A1 | 5/2010 | Nishioka | |
| 2010/0124139 A1 | 5/2010 | Dono | |
| 2010/0164604 A1 | 7/2010 | Park | |
| 2010/0238741 A1 | 9/2010 | Miyatake | |
| 2012/0161216 A1 * | 6/2012 | Liang | H01L 27/0285 257/296 |
| 2014/0138777 A1 * | 5/2014 | Wang | G11C 17/16 257/379 |

FOREIGN PATENT DOCUMENTS

WO     02/063689 A1     8/2002

OTHER PUBLICATIONS

European Search Report issued in corresponding application EP 13 19 1675.1, completed Apr. 24, 2014.

* cited by examiner

*Primary Examiner* — Han Yang
(74) *Attorney, Agent, or Firm* — Oblon, McClelland, Maier & Neustadt, L.L.P.

(57) ABSTRACT

The memory cell of a memory device comprises a MOS capacitor having a n-type gate and a n-type well, a first switch to temporarily apply a breakthrough voltage across the n-type gate and the n-type well to generate a permanent conductive breakthrough structure between the n-type gate and the n-type well.

11 Claims, 3 Drawing Sheets

MEMORY CELL AND MEMORY DEVICE

FIELD OF THE INVENTION

This application claims priority from European Patent Application No. 13191675.1 filed 5 Nov. 2013, the entire disclosure of which is incorporated herein by reference.

The present invention relates to the field of memory cells and memory devices and in particular to one-time programmable non-volatile memories. The invention also relates to a method of storing and reading at least one bit in a memory cell or from a respective memory cell.

BACKGROUND AND PRIOR ART

In the prior art there exists various approaches to provide one-time programmable memory cells. The U.S. Pat. No. 6,856,540 B2 for instance discloses a programmable memory cell comprised of a transistor located at the cross point of a column bit line and a row word line. The transistor has its gate formed from the column bit line and its source connected to the row word line. The memory cell is programmed by applying a voltage potential between the column bit line and the row word line to produce a programmed n+ region in the substrate underlying the gate of the transistor.

Arranging a multiplicity of transistors at cross points of column bit lines and row word lines may provide a storage capacity of several kilobytes. However, the arrangement of transistors at cross points of columns and rows requires a respective addressing scheme which forms a respective overhead, which may be disadvantageous for the design of miniaturized memory cells and are not suitable for small memories.

SUMMARY OF THE INVENTION

It is therefore an object of the present invention to provide a rather simple, compact and small size as well as cost efficient one-time programmable memory cell and a respective memory device. It is a further object of the invention to provide a method of storing and reading at least one bit in and from such a memory cell. Furthermore, the memory cell should provide non-volatile and permanent storage of the stored information. The memory cell should be rather robust and should be able to withstand even extreme external conditions in regard of temperature and humidity.

In a first aspect a memory cell of a memory device is provided. The memory cell comprises a MOS capacitor having a n-type gate and a n-type well. Additionally, the memory cell comprises a first switch to temporarily apply a breakthrough voltage ($V_M$) across the n-type gate and the n-type well to generate a permanent conductive breakthrough structure between the n-type gate and the n-type well of the MOS capacitor.

A n-type gate and n-type well-based MOS capacitor is particularly suitable to establish a permanent conductive breakthrough structure when it becomes subject to application of a breakthrough voltage, which may typically range above 6 V, around 8 V or even higher. The n-type gate and the n-type well internal structure of the MOS capacitor exhibit a particular and well-defined breakthrough behavior when a breakthrough voltage of a predefined magnitude is applied to the MOS capacitor. Application of the breakthrough voltage to the MOS capacitor leads to a definite energy deposition in the metal oxide between the n-type gate and the n-type well.

This energy deposition leads to the formation of a conductive breakthrough structure in the metal oxide layer or metal oxide structure of the MOS capacitor. In other words, the metal oxide structure of the MOS capacitor is damaged or even destroyed in a well-defined way so that the electrical resistivity between the n-type gate and the n-type well is reduced. The n-type gate and the n-type well are electrically connected via the conductive breakthrough structure and the MOS capacitor is no longer able to provide a substantially loss less storage of electrical charge.

By means of the first switch the n-type gate of the MOS capacitor is electrically connectable to a breakthrough voltage supply while the n-type well of the MOS capacitor is connected to ground. Closing of the first switch therefore leads to the application of the breakthrough voltage across the n-type gate and the n-type well, thereby generating and forming the permanent conductive breakthrough structure across the MOS capacitor.

Thereafter, when the first switch is opened or disconnected the conductive breakthrough structure of the MOS capacitor remains. This particular and well-defined destruction of the original function of the MOS capacitor can then be sampled by a readout unit. Depending on the configuration of the first switch during a storage or write procedure of the memory cell the respective MOS capacitor will either be destroyed or will remain intact. Thereafter, in a reading process the operability of the MOS capacitor can be detected or sampled, thereby representing a bit of information.

According to a further embodiment the memory cell comprises a second switch to apply a readout voltage (VDD) to the MOS capacitor. The readout voltage is typically of lower amplitude compared to the breakthrough voltage. The readout voltage serves to charge or to probe the MOS capacitor. Typically, the second switch is located between a VDD voltage supply and the n-type gate of the MOS capacitor. Closing of the second switch will then supply a respective readout voltage to the MOS capacitor, in particular to its n-type gate.

According to a further embodiment the memory cell also comprises a readout unit connectable to the MOS capacitor's n-type gate. Typically, the readout unit and the second switch are connected parallel to the n-type gate of the MOS capacitor. In this way, the readout unit may be permanently connected to the n-type gate of the MOS capacitor irrespective of a configuration of the second switch.

By means of the readout unit, the electrical behavior, hence the operability or function of the MOS capacitor can be detected or determined. The readout unit may typically comprise standard electronic components, such like a readout flip-flop or the like.

According to a further embodiment the second switch is closable to charge the MOS capacitor by means of the readout voltage. In order to initialize a readout procedure the second switch is typically closed for a predetermined time interval. Thereafter, the second switch may and can be opened so that a provided electrical charge remains stored in the MOS capacitor.

According to a further embodiment the readout unit is operable to sample the MOS capacitor at a predefined time $\Delta t$ after the second switch has been opened. Typically, sampling of the MOS capacitor is conducted in various steps. In a first step the second switch is closed to charge the MOS capacitor. Thereafter, the second switch is opened again. Then, after the second switch has been opened, a predefined time should lapse before the readout unit actually samples or probes the MOS capacitor. Waiting for a predefined time interval between disconnecting the MOS capacitor from the readout voltage and sampling of the MOS capacitor allows providing a charge dissipation when the MOS capacitor has been damaged by the breakthrough voltage during the writing procedure.

In the event that the particular MOS capacitor became actually subject to application of a breakthrough voltage during the writing procedure, the MOS capacitor will no longer be able to store an electric charge over the predefined time interval Δt. As a consequence and when sampling the MOS capacitor the readout unit will not be able to retrieve a charge of respective magnitude compared to the sampling of a MOS capacitor that did not become subject to the breakthrough voltage during the writing procedure.

In this way, a rather simple and cost efficient readout unit can be implemented which is just operable to detect whether the MOS capacitor comprises a charge of predefined magnitude when disconnected from a readout voltage over a predefined time interval Δt.

According to another embodiment the second switch is closable only when the first switch is opened. In this way, the reading procedure can be precisely separated from a previous writing procedure.

According to a further embodiment the first switch comprises a cascoded switch. In this way, the first switch remains operable even when it is subject to application of the comparatively high breakthrough voltage. The cascoded switch is a two- or multiple stage switch, typically implemented by a series of MOSFET transistors. By making use of a cascoded switch as the first switch, the first switch remains intact even when the comparatively high breakthrough voltage is applied.

In a further embodiment the memory cell comprises a resistor in series with a third switch. The series connection of resistor and third switch is typically connected parallel to the MOS capacitor. By means of the resistor and by means of the third switch the readout unit can be protected against the comparatively large breakthrough voltage applied during a writing procedure. Typically, the third switch is connected to ground with one end while the other end is connected to the resistor.

The opposite end of the resistor facing away from the third switch is typically coupled with the n-type gate of the MOS capacitor. In this way, a current arising from the application of the comparatively high breakthrough voltage may flow through the resistor and does not harm or destroy the readout unit.

According to a further embodiment the third switch is coupled to the first switch. In this way third switch and first switch may be operable in unison. Moreover, it is conceivable, that the third switch is closable during a write operation of the memory cell in general and independent on whether the first switch is closed or not. In this way, the readout unit can be protected against the comparatively breakthrough voltage irrespective on whether the breakthrough voltage is applied to the MOS capacitor or not.

In still another embodiment the MOS capacitor is a thin oxide capacitor. Typically, the MOS capacitor is designed in 180 nm technology. It comprises a rather thin, compact and cost efficient structure. Moreover, the memory cell is a one-time programmable memory cell. Once applying the breakthrough voltage across the MOS capacitor the internal structure of the MOS capacitor irreversibly and permanently changes. After an initial writing procedure the memory cell is only operable to conduct one or a consecutive series of readout procedures.

In a further aspect the invention also relates to a memory device comprising at least two or more memory cells as described above. Each memory cell comprises the at least first switch by way of which each memory cell may be individually configured, either to store a 1-bit or a 0-bit. A 1-bit may be obtained by not applying the breakthrough voltage across the MOS capacitor during the writing procedure while the 0-bit may be obtained when the breakthrough voltage is in fact applied across the MOS capacitor by closing the first switch. However, the assignment of 0-bit and 1-bit to the undamaged or damaged MOS capacitor may be swapped according to the settings and configuration of the readout unit.

By implementing a row of n memory cells n bit of information can be stored in the one-time programmable memory device.

According to a further aspect the invention also relates to a method of storing and reading at least one bit in a memory cell as described above. Storing of a bit comprises at least the step of closing of a first switch to apply a breakthrough voltage across an n-type gate and an n-type well of a MOS capacitor of the respective memory cell. Reading of a previously stored bit from the memory cell is obtained by another embodiment of said method. For reading, the method comprises the steps of:

applying a readout voltage to the MOS capacitor for charging the MOS capacitor, disconnecting the MOS capacitor from the readout voltage and sampling the MOS capacitor by means of a readout unit at a predefined time Δt after the MOS capacitor has been disconnected from the readout voltage.

In this way the readout procedure serves to detect the operability of the MOS capacitor. Sampling of the MOS capacitor after lapsing of a predefined time interval Δt since the MOS capacitor has been charged reveals whether the MOS capacitor has been damaged or not during a previous writing procedure.

It is generally to be noted here, that the method of storing and reading at least one bit in a memory cell is directly related to the memory cell and to the memory device as described above. Consequently, all features and issues mentioned and described above in connection with the memory cell and the memory device equally apply to the method of storing and reading at least one bit in or from said memory cell, and vice versa.

Making use of a MOS capacitor based on a n-type gate and a n-type well has the particular advantage, that the MOS capacitor exhibits a well-defined conductive behavior when the conductive breakthrough structure has been established in its metal oxide layer. With other types of MOS capacitors parasitic transistors or parasitic diode effects may establish in the MOS capacitor that would hinder and counteract a precise and simple readout and sampling of the MOS capacitor during a readout procedure.

Moreover, the memory cell on the basis of the n-gate and n-well MOS capacitor is rather robust and stable. In first tests, wherein a breakthrough voltage of 8.8 V has been applied over 2 ms, a well-defined conductive breakthrough structure across the MOS capacitor established. Even keeping the memory cell or the MOS capacitor at an elevated temperature of 250° C. for one week did not lead to a detectable degradation of the conductive breakthrough structure and the electrical behavior of the MOS capacitor. In this way, a rather temperature resistant and robust memory cell and respective memory device can be implemented.

BRIEF DESCRIPTION OF THE DRAWINGS

In the following, various embodiments of the invention will be described by making reference to the drawings, in which.

DETAILED DESCRIPTION

Figure 1:
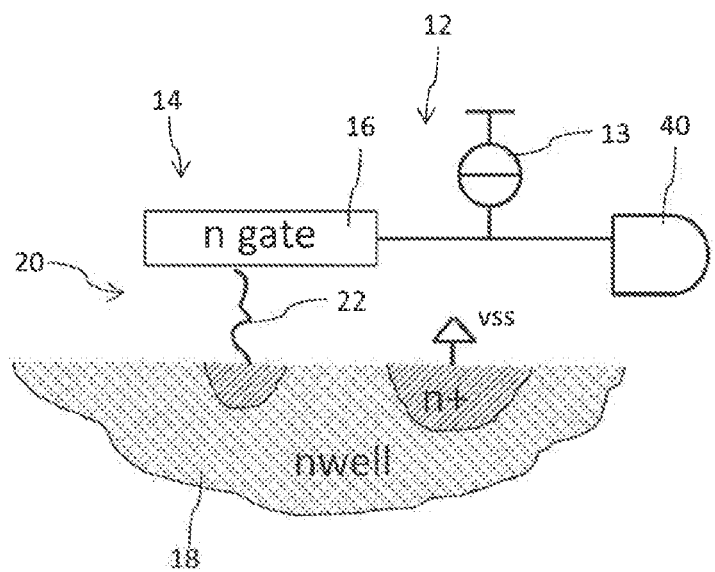
FIG. 1 schematically illustrates the internal structure of a MOS capacitor as used in a memory cell according to the present invention.
Figure 2:
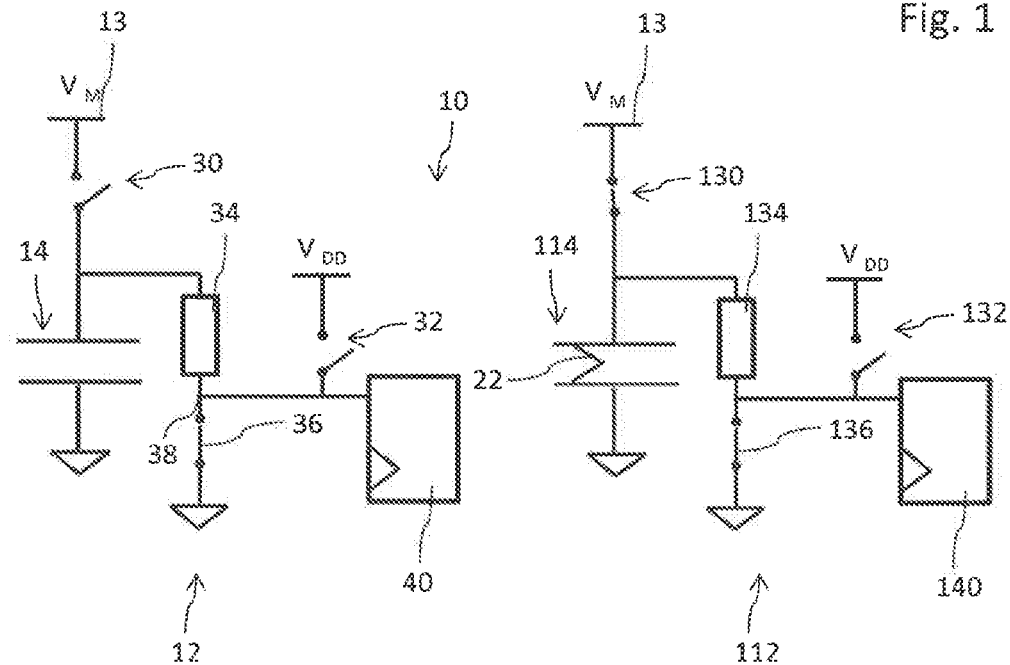
FIG. 2 is indicative of two memory cells to form a 2-bit memory device during a writing operation.

The memory device 10 as indicated in FIG. 2 comprises two memory cells 12, 112. In FIG. 1, the memory cell 12 is illustrated in a more detailed view. The memory cell 12 comprises a MOS capacitor 14 featuring a n-type gate 16 as well as a n-type well 18. The n-type well 18 is connected to ground (VSS) as indicated in FIG. 1. The n-type gate 16 of the MOS capacitor 14 is connectable to a voltage source 13 as well as to a readout unit 40. By means of the voltage source 13 a breakthrough voltage ($V_M$) can be applied across the n-type gate 16 and the n-type well 18. The breakthrough voltage is selected as high as to destroy the oxide layer 20 located between the n-type gate 16 and the n-type well 18.

As a consequence, a permanent conductive breakthrough structure 22 will be formed between the n-type gate 16 and the n-type well 18, thereby providing an electrically conductive interconnection between the n-type gate 16 and the n-type well 18. In other words, applying the breakthrough voltage to the n-type gate 16 destroys the MOS capacitor 14 in a well-defined way.

This permanent and hence irreversible modification of the MOS capacitor 14 is then to be sampled by the readout unit 40 in order to assign a 0-bit or a 1-bit to the respective memory cell 12.

In FIG. 2, a memory device 10 comprising two memory cells 12, 112 is illustrated. The two memory cells 12, 112 are substantially equal. Therefore, the internal structure of only memory cell 12 will be described in the following in greater detail. The memory cell 12 comprises the MOS capacitor 14 which is connected to ground with its n-type well 18. The n-type gate 16 of the MOS capacitor 14 is connected to a switch 30, which in turn is connected to the voltage supply 13.

Additionally and parallel to the first switch 30 there is provided a resistor 34, which is connected to ground via a third switch 36. Between the third switch 36 and the resistor 34, there is located a node connected to a readout unit 40. This particular node 38 is furthermore connected to a second switch 32 by way of which a readout voltage (VDD) can be supplied to the n-type gate 16 of the MOS capacitor 14.

During a writing procedure as indicated in FIG. 2, the third switches 36, 136 of the two memory cells 12, 112 are closed. In this way, applying of the breakthrough voltage to the MOS capacitor 114 by closing of the first switch 130 does not affect or harm the readout unit 140. A respective current flows to ground via the resistor 134 and the closed switch 136.

A comparison of the two memory cells 12, 112 of FIG. 2 reveals that only the first switch 130 of memory cell 112 is closed. Consequently, only the MOS capacitor 114 of memory cell 112 is supplied with the breakthrough voltage ($V_M$), thereby inducing the above mentioned conductive breakthrough structure 22 in the respective MOS capacitor 114. The MOS capacitor 14 of the memory cell 12, which is not affected by the breakthrough voltage remains intact while the MOS capacitor 114 is destroyed in a well-defined and controlled way.

Figure 3:
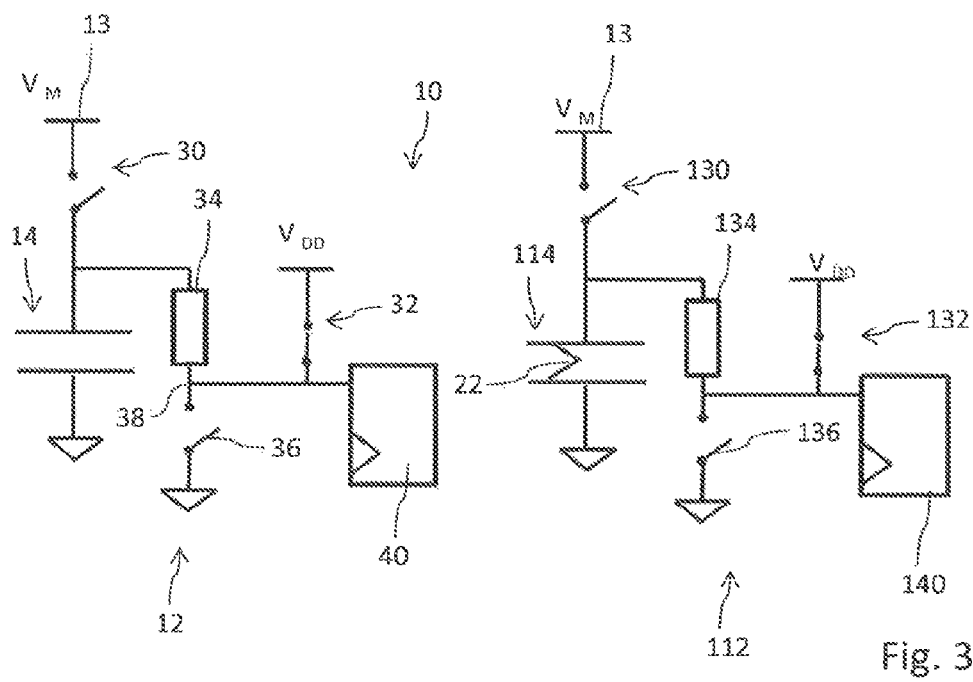
FIG. 3 is indicative of the memory device according to FIG. 2 during a first step of a readout procedure.

A first step of a reading out procedure of the memory device 10 is shown in FIG. 3. In comparison to the configuration according to FIG. 2 the third switches 36, 136 are now open. In this way the second switches 32, 132 can be closed in order to provide a readout voltage (VDD) to the MOS capacitors 14, 114. Hence, in this first step of readout the MOS capacitors 14, 114 are charged. Since only MOS capacitor 14 remains intact while MOS capacitor 114 has been destroyed a respective probe charge will only be kept in the capacitor 14. Due to the conductive breakthrough structure 22 established during the previous writing procedure the electric charge provided to the MOS capacitor 114 will flow away via the n-type well thereof.

Figure 4:
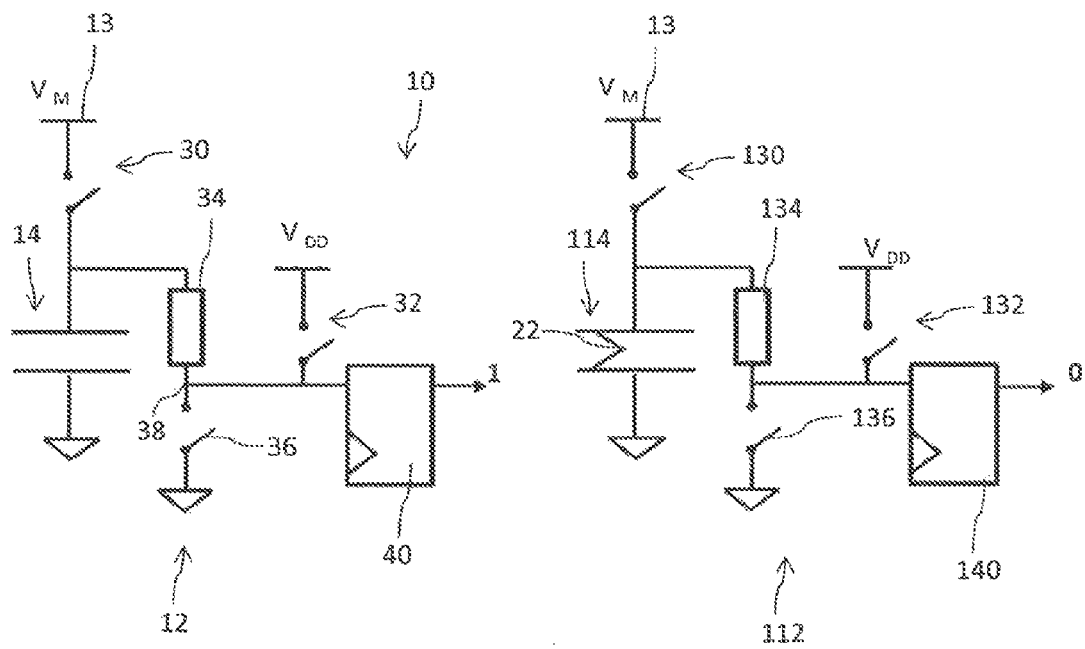
FIG. 4 shows the memory device according to FIG. 3 in a second step of the readout procedure.

In a subsequent second step of reading out the second switches 32, 132 are open. As shown in FIG. 4, all three switches 30, 130, 32, 132, 36, 136 are then opened. As a consequence only the readout units 40, 140 are connected to the n-type gate 16 of the respective MOS capacitors 14, 114. As indicated in FIG. 4 it is only the MOS capacitor 14 that still acts as a capacitor and which therefore still keeps the previously stored electrical charge.

The charge status of the MOS capacitors 14, 114 can be sampled and measured by the readout units 40, 140. As a consequence, the readout unit 40 of memory cell 12 reveals a digital 1 whereas the readout unit 140 of memory cell 112 is unable to detect a predefined charged level of the destroyed MOS capacitor 114. As a consequence, the readout unit 140 shows a different information bit compared to the readout unit 40.

The present invention is by no way limited to the implementation of only two memory cells 12, 112. It is conceivable, that a large series of memory cells 12, 112 is arranged in a row. Activation and deactivation of the various switches 30, 32, 36, 130, 132, 136 may be controlled by some type of controlling device operable to individually and selectively open and close the various switches of each memory cell 12, 112.

Figure 5:
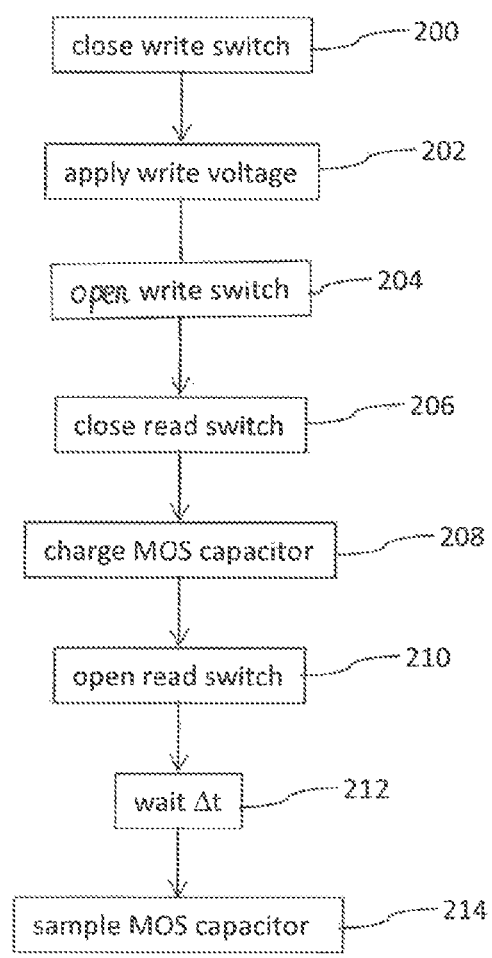
FIG. 5 shows a flowchart of the method of writing and reading of the memory cell or of the memory device.

In the flowchart according to FIG. 5 the various steps of writing and reading of bits of information are shown. In a first step 200 selected first switches 30, 130 of various memory cells 12, 112 are either closed or opened, and the third switches, 36, 136 are closed. Here, the first switches act as write switches. Thereafter and as illustrated in FIG. 2 the breakthrough voltage is applied to the n-type gate 16 of the various MOS capacitors 14, 114 in step 202. In the following step 204 the first switches 30, 130 of the memory cells 12, 112 are all open. Simultaneously or afterwards also the third switches 36, 136 are opened or disconnected. In a subsequent step 206 the second switches 32, 132 of all memory cells 12, 112, acting as read switches are closed in order to charge the MOS capacitors 14, 114 of all memory cells 12, 112 in the subsequent step 208.

Thereafter, the second switches 32, 132 of all memory cells 12, 112 are opened again in step 210. Before the MOS capacitors 14, 114 of all memory cells 12, 112 are sampled by respective readout units 40, 140 in step 214 a predefined period of time Δt will lapse in step 212. During this period of time Δt, which may last for about several microseconds, the charge provided to a damaged MOS capacitor 114 may have dissipated or may have flown away in order to be able to electrically distinguish programmed and non-programmed, hence damaged and non-damaged MOS capacitors 14, 114.

What is claimed is:

1. A memory cell of a memory device, the memory cell comprising:
    a MOS capacitor having a n-type gate and a n-type well;
    a first switch configured to temporarily apply a breakthrough voltage across the n-type gate and the n-type well to generate a permanent conductive breakthrough structure between the n-type gate and the n-type well;
    a second switch and a third switch;
    a readout unit connectable to the n-type gate; and
    a first node of a resistor connected with a drain or a source of the third switch,
    wherein a second node of the resistor is connected to the MOS capacitor, the first node of the resistor being connected to the readout unit and a drain or a source of the second switch.

2. The memory cell according to claim 1, wherein the second switch is configured to apply a readout voltage to the MOS capacitor.

3. The memory cell according to claim 2, wherein the second switch is closable to charge the MOS capacitor.

4. The memory cell according to claim 3, wherein the readout unit is configured to sample the MOS capacitor at a predefined time after the second switch has been opened.

5. The memory cell according to claim 2, wherein the second switch is closable only when the first switch is open.

6. The memory cell according to claim 1, wherein the first switch comprises a cascode-type switch.

7. The memory cell according to claim 1, wherein the third switch is coupled to the first switch and/or wherein the third switch is closable during a write operation of the memory cell.

8. The memory cell according to claim 1, wherein the MOS capacitor is a thin oxide capacitor.

9. The memory cell according to claim 1, wherein the memory cell is one-time programmable.

10. A memory device comprising at least two or more memory cells according to claim 1.

11. A method of storing and reading at least 1-bit in a memory cell according to claim 1, the method comprising:
    closing of the first switch and the third switch to apply the breakthrough voltage across the n-type gate and the n-type well;
    opening the first switch and the third switch after generating the permanent conductive breakthrough structure between the n-type gate and the n-type well;
    closing a second switch to apply a readout voltage through the resistor to the MOS capacitor;
    opening the second switch after charging the MOS capacitor; and
    sampling the MOS capacitor by the readout unit at a predefined time after the second switch has been opened.

* * * * *